United States Patent [19]
Pelella et al.

[11] Patent Number: 5,770,881
[45] Date of Patent: Jun. 23, 1998

[54] SOI FET DESIGN TO REDUCE TRANSIENT BIPOLAR CURRENT

[75] Inventors: Mario M. A. Pelella, Poughkeepsie; Fariborz Assaderaghi, Mahopac; Lawrence Federick Wagner, Jr., Fishkill, all of N.Y.

[73] Assignee: International Business Machines Coproration, Armonk, N.Y.

[21] Appl. No.: 712,538

[22] Filed: Sep. 12, 1996

[51] Int. Cl.$^6$ .................................................. H01L 27/01
[52] U.S. Cl. ........................... 257/347; 257/348; 257/349
[58] Field of Search .................................... 257/347, 348, 257/349, 351, 352, 353, 354

[56] References Cited

U.S. PATENT DOCUMENTS

| | | | |
|---|---|---|---|
| 4,797,721 | 1/1989 | Hsu | 357/23.7 |
| 4,864,377 | 9/1989 | Widdershoven | 357/23.8 |
| 4,899,202 | 2/1990 | Blake et al. | 357/23.7 |
| 4,946,799 | 8/1990 | Blake et al. | 437/41 |
| 5,034,335 | 7/1991 | Widdershoven | 437/21 |
| 5,138,409 | 8/1992 | Kawai | 257/23.4 |
| 5,400,277 | 3/1995 | Nowak | 365/154 |
| 5,420,055 | 5/1995 | Vu et al. | 437/40 |
| 5,463,238 | 10/1995 | Takahashi et al. | 257/351 |
| 5,463,241 | 10/1995 | Kubo | 257/376 |
| 5,485,028 | 1/1996 | Takahashi et al. | 257/347 |
| 5,489,792 | 2/1996 | Hu et al. | 257/347 |
| 5,572,040 | 11/1996 | Reedy et al. | 257/9 |
| 5,574,292 | 11/1996 | Takahashi et al. | 257/59 |

FOREIGN PATENT DOCUMENTS

| | | |
|---|---|---|
| 62-095859 | 5/1987 | Japan . |
| 4-259259 | 9/1992 | Japan . |

OTHER PUBLICATIONS

"Silicon–on–Insulator Technology: Materials to VLSI"; Jean–Pierre Colinge; IMEC, Belgium; pp. 144–149, 1991.
Low–Voltage Transient Bipolar Effect Induced by Dynamic Floating–Body Charging in Scaled PD/SOI MOSET's; Mario M. Pelella et al; 1996 IEEE.
"Low–Voltage Transient Bipolar Effect Induced by Dynamic Floating–Body Charging in PS/SOI MOSFETs"; Mario M. Pelella et al.; Final Camera Ready Art; Oct. 1995.
Suppression of Parasitic Bipolar Effects and Off–State leakage in Fully–Depleted SOI n–MOSFET's Using Ge–Implantation; Hua–Fang Wei et al; 1995 IEEE.

*Primary Examiner*—Sara W. Crane
*Attorney, Agent, or Firm*—Whitham, Curtis, Whitham & McGinn; Susan Murray, Esq.

[57] ABSTRACT

Producing a gap between a source and/or drain region of a silicon-on-insulator (SOI) field effect transistor which is less than the thickness of a depletion region normally surrounding the source and/or drain region, preferably at zero volts bias, permits gain of a parasitic bipolar transistor formed therewith to be transiently reduced and the effective base-emitter junction capacitance to be transiently increased during only modes of operation in which the parasitic bipolar conduction dominates normal operation of the field effect transistor. Such transient reduction of gain coupled with a transient reduction of high frequency response reduces the parasitic bipolar current spike to a degree greater than previously achievable and is fully compatible with other techniques of reducing such current spike. As applied to an SOICMOS SRAM, the transistor structure including such a gap is effective in suppressing half-select write disturb effects while maintaining the benefits of excess charge storage and floating body effects in the transistor.

21 Claims, 6 Drawing Sheets

SOI FET DESIGN TO REDUCE TRANSIENT BIPOLAR CURRENT

BACKGROUND OF THE INVENTION

1. Field of the Invention

The present invention generally relates to the design of field effect transistors (FETS) using silicon-on-insulator (SOI) technology and, more particularly, to SOICMOS transistors used in static random access memories (SRAMS) and other devices using pass gates or transfer gates formed by SOI technology in which transient current in parasitic bipolar transistors formed with the FET as a transfer gate can cause instability of a memory cell.

2. Description of the Prior Art

Data processors must be supported by memory arrangements for storage of both the instructions which they are to carry out and the data upon which operations are to be performed in accordance with the instructions. Generally several different types of memory devices are used, depending on the need to change data stored therein, speed of access, the amount of data accessed and frequency of access required to support the speed of operation of modern data processors. Generally a mass storage is provided for storage of applications programs and files together with a substantial quantity of random access memory from which much smaller quantities (e.g. groups of bytes) of data and/or instructions can be accessed at extremely high speed and frequency of access. Caching schemes are often implemented to improve apparent access time from the mass storage.

Much of the random access memory (RAM) is commonly provided in so-called dynamic RAM or DRAM since dynamic memory cells have very small element counts and very high integration density and memory capacity per chip can be readily achieved. However, DRAMs do not provide optimal access speed since they must be refreshed periodically to maintain stored signals and are not available during periods the refresh operation is being carried out. Further, since signals are capacitively stored as extremely small amounts of charge which is subject to leakage, sense amplifier operation may be slowed somewhat. Accordingly, so-called static RAM (SRAM) is generally provided for optimally fast access by the processor even though cost of such memory is much greater and many fewer memory cells can be provided on a single chip because a plurality of transistors are required for each memory cell.

Recent SRAM designs have often exploited silicon-on-insulator (SOI) technology which provides significant advantages when the memory cell circuits are formed using CMOS field effect transistors. This technology is characterized by the formation of a thin silicon layer for formation of the active devices over an insulating layer, such as an oxide, which is, in turn, formed over a substrate. Transistor sources and drains are formed by, for example, implantations into the silicon layer while transistor gates are formed by forming a patterned oxide and conductor (e.g. metal) layered structure. Such structures provide a significant gain in performance by having lower parasitic capacitance (due to the insulator layer) and increased drain current due to floating body charging effects (since no connection is made to the channel region and charging of the floating body provides excess storage of majority carriers which dynamically lower the threshold voltage, resulting in increased drain current). However, the floating body can introduce dynamic instabilities in the operation of such a transistor.

Specifically, an SOI field effect transistor comprises two separated impurity regions, generally formed by implantation, constituting the source and drain of the transistor with the channel region between them covered by a thin gate insulator and a conductive gate. No electrical connection is made to the channel region and therefore the channel region between the source and drain is electrically floating because the source and drain regions normally extend entirely through the thin silicon layer. The boundaries between the channel region and the source and drain, respectively, form junctions which are ordinarily reverse biased. Conduction in the channel region normally occurs immediately below the gate insulator in the region in which depletion can be controlled by the gate voltage. However, the junctions at the boundary of the source and drain also form a parasitic lateral bipolar transistor which, in effect, exists somewhat below the field effect transistor and may supplement desired channel current. On the other hand, the parasitic bipolar device cannot be controlled and under some bias conditions, the operation of the parasitic bipolar device may transiently dominate the operation of the field effect transistor and effectively occupy substantially the entire silicon layer at times that channel current is not desired.

For example, when such a transistor is used in a SRAM cell or other logic device, each of the source, gate and drain is generally held at one of two voltage levels corresponding to one of two logic states. However, if the source and drain are both at a high logic level (e.g. 2.5 volts), as may occur, for example, when portions of the circuit are precharged, the channel region will also become charged to that voltage. If the drain (or source) electrode of the transistor is then quickly changed to a low logic level (e.g. 0.0 volts) the junction between the drain or source and the channel region will become forward biased and electrons are injected from the drain or source (e.g. the bit line diffusion, which is thus effectively the emitter of the parasitic lateral bipolar transistor) through the channel region (which forms the base of the parasitic bipolar transistor). This source-to-drain (e.g. emitter-to-collector) current, in turn, causes conduction of the parasitic transistor, which develops a large current spike, even when the gate is held at a low logic level which is otherwise sufficient to turn off the field effect transistor. This transient conduction effect is newly discovered and further details and analysis thereof are to be found in "Low-Voltage Transient Bipolar effect Induced by Dynamic Floating Body Charging in Scaled PD/SOI MOSFET's" by M. M. Pelella et al., IEEE Electron Device Letters, Vol. 17, No. 5, May 1996, which is hereby fully incorporated by reference. In essence, the conduction effect is such that the parasitic bipolar transistor will conduct for a brief period even though the field effect transistor is theoretically "off" simulating the effect of the field effect transistor being briefly turned on but developing higher currents during the brief current spike.

In a SRAM cell, regardless of the details thereof, it is customary to perform selection and deselection with a pair of transistors in each memory cell which are connected, respectively, as transmission gates between memory or storage nodes of the cell and respective ones of a complementary pair of bit lines (so called by convention) which carry data being written or read. The transmission gates have their gates connected to a word line (again, so called by convention) which thus controls connection of the memory cell to the bit lines.

In modern SRAM designs, it is also customary to precharge the bit lines to a high logic level prior to a read or write operation to allow faster response of the memory device. Thus, regardless of the logic state of any particular memory cell, one of the transistors of the pair of transmission gate (or transfer gate) transistors in every cell of the memory will have both source and drain driven to a high logic level which will cause charging of the floating body.

During read operations, a data "0" on the selected memory cell allows the corresponding precharged bit line to discharge while a data "1" holds the opposite precharged bit line high until the differential voltage can be sensed by sense amplifiers. Since a bit line is pulled to a low logic level relatively slowly through a transmission gate and memory cell, parasitic bipolar conduction is not observed at deselected transfer gates. On the other hand, during a write operation, one of the precharged bit lines is driven low and the transition occurs much more rapidly (e.g. the transient conditions are confined to a shorter period) causing much higher current levels and resulting in the instability described above. When the logic state of the cell is to be changed, that same transistor will have the logic level at the drain (or source) change rapidly from a high to low logic level. This condition is thus identical to the conditions described above which cause conduction in the parasitic bipolar transistor.

When the memory cell has been selected, the field effect transistor of the transmission gate will be conductive and the cell is written to in the normal fashion. However, even when the transistor is deselected and the channel of the field effect transistor is non-conductive in the proximity of the gate, the parasitic lateral bipolar transistor within the silicon layer may conduct sufficiently (depending on the amount of charge stored on the floating body) to cause a change of state of a corresponding deselected memory cell. Since the transistor is deselected but the bit lines are driven, this effect or instability is referred to as a "half-select write disturb". Hence, the write operation will be conducted correctly for the selected cell where the field effect transistor is "on". However, every deselected memory cell (where the field effect transistor is theoretically "off") connected to the same bit line pair which is of the opposite state to the data being written is placed in jeopardy of having its logic state reversed by the write operation.

While the amount of charge on the floating body is small (estimated to be about 25 fC for a 70 Angstrom thick gate oxide at 2.5 volts on a 0.5×10.0 $\mu$m gate) the dQb/dt current together with a displacement capacitor current (Cdv/dt) and confined to the duration of the bit line transient causes a drain current spike which may reach a magnitude of several milliamps for a bit line discharge rate of 1.0 volts/80 psec of faster. This effect is somewhat more pronounced near the bit line drivers but transient voltages in the bit lines may also cause change of state of other memory cells and which may be affected by the location of a selected cell in an unpredictable fashion. Further, this effect is expected to become more pronounced with increased stored charge as the gate oxide is made thinner in more aggressive SRAM designs.

It has been the common practice in SRAM designs to increase cell stability by increase of the beta ratio of the driver transistors in the memory cell to the transfer gate transistors. The beta ratio is defined as the ratio of the respective channel widths divided by the respective channel lengths (e.g. $W_D/L_D:W_{TG}/L_{TG}$) and is a measure of the relative conductivity of the two transistors. That is, when the driver transistor is more conductive, current through the transmission gate transistor has relatively less effect on the memory cell circuit due to the voltage divider action of these two transistors. Beta ratios of about 1.5 to 2.0 are commonly used in current SRAM designs but are insufficient to prevent or suppress the above-described instability in adequate degree.

Increase of beta ratio above 2.0 to suppress half select write disturb is impractical since increase of width of the driver transistor channel would consume a prohibitive amount of space in current or future SRAM designs at high integration density and high numbers of memory cells per chip, in which case any size increase would be multiplied many (potentially several million) times. Channel length of the driver transistors cannot be significantly reduced without introducing other undesirable effects (e.g. so-called short channel effect, punch-through and the like).

Further, decreasing conductivity of the transfer gate transistor is impractical to increase beta ratio since lower conductivity increases cell access time and may compromise the voltage swing at the memory cell to achieve a change of state thereof. In other words, at beta ratios significantly above 2.0, the memory cell would become so stable that both speed and reliability of writing operations would be compromised. In summary, the design of an SRAM cell circuit does not allow for avoidance of half select write disturb effects since the current in the parasitic lateral bipolar transistor, when it occurs, is comparable to the current through a selected field effect transistor in normal operation in accordance with the design.

Therefore, traditional methods of increasing stability of memory cells and increasing operating margins of other logic devices appear to provide little, if any, potential for correcting this newly discovered effect which may become more pronounced in future, more aggressive designs for integrated circuit pass gate logic and memory.

SUMMARY OF THE INVENTION

It is therefore an object of the present invention to provide a field effect transistor using silicon-on-insulator technology in which transient parasitic bipolar current is reduced to low levels.

It is another object of the invention to provide an alternative to adjustment of relative dopant levels for adjustment of gain of a parasitic bipolar device without affecting operation, performance or potential integration density of an SOI FET.

It is a further object of the invention to provide a high performance FET design in which parasitic bipolar effects are severely limited.

It is yet another object of the invention to provide increased memory cell stability in integrated circuit SRAMs and DRAMs using SOICMOS transistors while minimizing alteration of any other design or operating characteristics thereof.

In order to accomplish these and other objects of the invention, a silicon-on-insulator field effect transistor and a logic circuit such as a memory including the same is provided including a gap between at least one of said source and drain regions and said insulator layer having a width equal to or less than a thickness of a depletion region at approximately zero volts bias between one of the source and drain regions and the silicon layer.

In accordance with another aspect of the invention, a method of operating a silicon-on-insulator field effect transistor is provided including the steps of causing a depletion region to fill a gap between one of a source region and a drain region of the silicon-on-insulator field effect transistor and an insulator layer below the field effect transistor, and transiently reducing thickness of the depletion region to a thickness less than said gap.

BRIEF DESCRIPTION OF THE DRAWINGS

The foregoing and other objects, aspects and advantages will be better understood from the following detailed description of a referred embodiment of the invention with reference to the drawings, in which.

DETAILED DESCRIPTION OF A PREFERRED EMBODIMENT OF THE INVENTION

Figure 1:
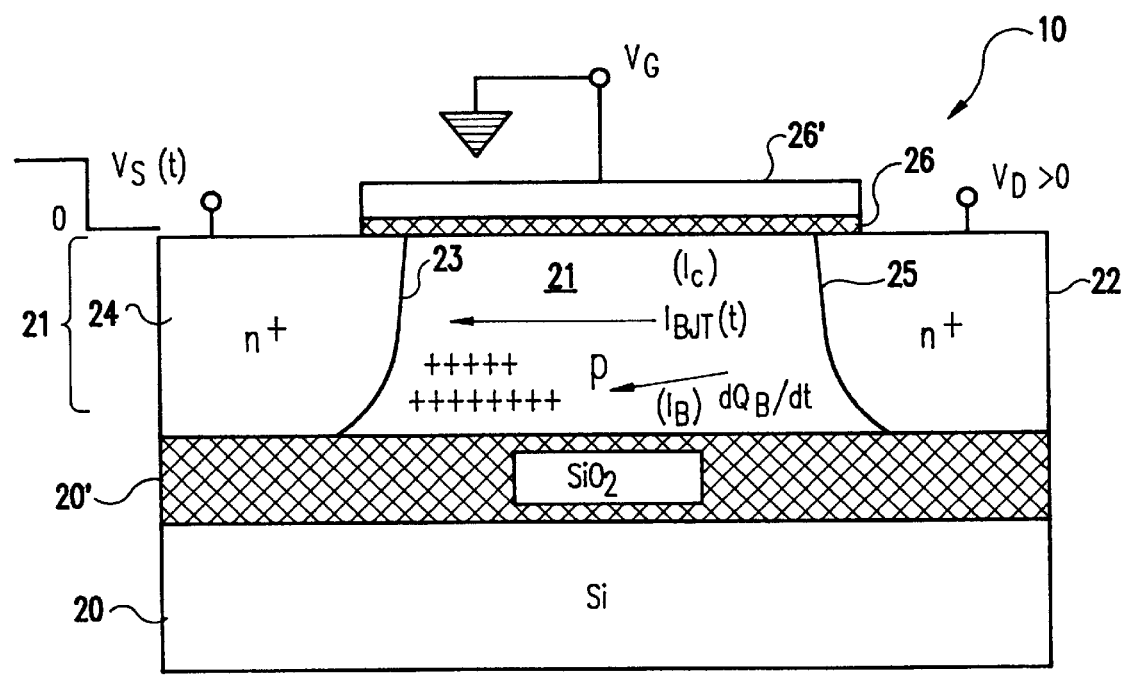
FIG. 1 is a cross-sectional view of a conventional FET fabricated in SOI technology.

Referring now to the drawings, and more particularly to FIG. 1, there is shown, in cross-section, an SOI FET 10 (assumed to be n-type for the following discussion but which is equally applicable to p-type FETs) as currently used in SRAMs. It is to be understood that no portion of FIG. 1 is admitted to be prior art but is provided to allow comparison with the present invention, shown in a similar view in FIG. 4, to facilitate an understanding of the principles of the invention. In this transistor, the source and drain impurity regions 22, 24 extend entirely through the silicon layer 21 formed on an insulator 20' which is formed over a substrate 20. The gate insulator 26 and gate electrode 26' are formed on the surface of silicon layer 21 and, hence, no electrical connection is made to the channel region 21' which is thus sometimes referred to hereinafter as a floating body.

When a high logic level voltage is applied to both drain (sometimes referred to as a node diffusion in the context of an SRAM) region 22 and source (sometimes referred to as a bit line diffusion in the context of an SRAM) region 24, and a low logic level is applied to the gate electrode 26', as would, for example, be the case during precharge of bit lines of a SRAM or dynamic pass gate logic circuit, the floating body or channel region 21' under gate oxide 26 will accumulate thermally generated carriers (in this case, holes, indicated by "+"). If the bit line (source or drain) is then pulled to a low logic state, as would be the case when writing to a selected SRAM cell or evaluation of logic inputs, junction 23 will be forward biased and electrons will be injected into the floating body and collected by junction 25 and the accumulated carriers will be discharged into junction 23 as recombination current, as indicated by arrow $dQ_B/dt$. This injected and collected electron current in the parasitic lateral bipolar junction transistor including junctions 23 and 25 causes a current spike $I_{BJT}(t)$ through the parasitic transistor.

If the transistor is connected as a transfer gate between a bit line of a memory and a storage node of an SRAM (or DRAM) memory cell, the current spike will tend to discharge the storage node through the node (source) diffusion. In an SRAM, this discharge current is transiently far greater than the current that can be delivered to the storage node by the bistable circuit of the SRAM memory cell and may cause reversal of the storage state of the memory cell. In a DRAM, of course, there is generally no mechanism to resupply the charge lost during the discharge. Refresh of a DRAM may not be correctly carried out if the discharge is too great. Similar conduction effects can occur in pass gate logic which includes transistors embodying logic trees connected to load transistors in much the same way as the connections of the transfer gates are connected to a bistable circuit of an SRAM. Therefore, while the following description of the invention is placed in the context of an application of the invention to SRAMs, it is to be understood that the invention is applicable to virtually any device including SOI FETs.

The magnitude of the current spike is a function of both the amount of excess charge on the floating body (which determines the magnitude of the base current) and the gain of the parasitic transistor. The amount of excess charge can be beneficial to the speed of response of the memory device since it can increase the current which can be provided by the transistor during normal operation. Accordingly, reduction of excess charge may reduce the performance advantages of SOI FET technology in logic applications.

Gain of bipolar transistors, whether parasitic or not, can be altered by altering relative base, emitter and collector doping levels or concentrations. However, alteration of the source and drain doping levels relative to the channel doping level or vice-versa of an FET may alter the width (e.g. thickness) of the depletion region surrounding the junction formed by the boundary of the drain and source impurity regions. In an FET formed as a bulk device, decrease of the width of the depletion region would increase depletion capacitance and reduce switching speed. That effect is reduced but remains present when the FET is formed to occupy a thin silicon layer using SOI technology.

More importantly in SOI technology, an increased thickness of the depletion region effectively shortens the channel of the FET and compromises many electrical properties which are important in digital circuits as well as consuming chip space and compromising integration density when suitable channel length is maintained. This latter problem is particularly severe in SRAMs since each memory cell includes a plurality of transistors and the space occupied by the depletion region would be multiplied by the number of sources and drains of all transistors on a chip, severely compromising the number of memory cells which can be fabricated on a chip of practical dimensions. Further, the reduction of gain of the parasitic bipolar transistor and the amount of excess charge which could be stored would be reduced at all times and under all operational conditions while the half-select write disturb effect occurs only during a brief interval during a write cycle, even though it is unavoidable when the write operation is carried out in a precharged manner. Additionally, the limitation of gain by channel dopant concentration adjustment is limited in effectiveness of current reduction since increases in channel dopant concentration beyond a particular level does not provide any significant current reduction. Thus, while adjustment of dopant concentration can be used for adjusting gain of bipolar transistors, in general, such a possibility does not provide a suitable or practical solution for fully suppressing floating body charge conduction in parasitic SOI FETs, particularly when used in SRAMs and DRAMs.

Figure 2B:
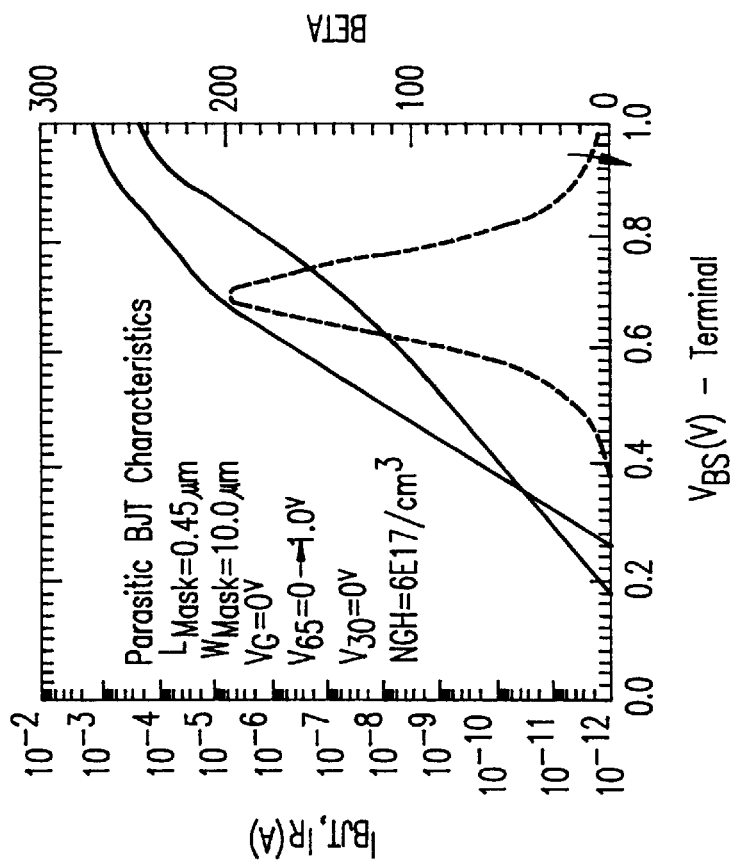
FIGS. 2A and 2B are Gummel plots showing the gain of conventional parasitic bipolar transistors existing in the structure of FIG. 1 at different channel dopant concentrations.
Figure 2A:
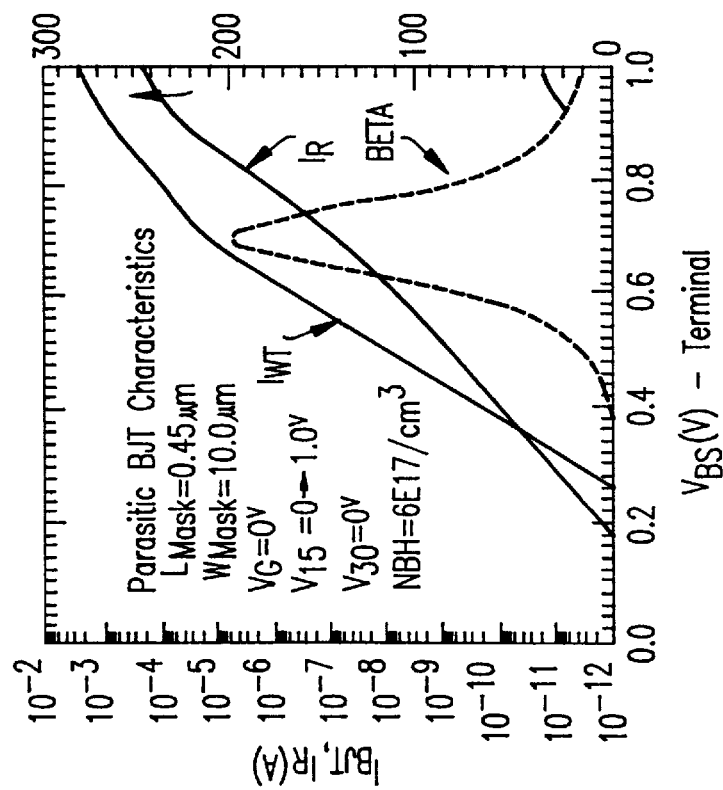

More specifically and with reference to FIGS. 2A and 2B, Gummel plots of recombination current $I_R$, referred to as base current, and transistor (transport) current $I_{BJT}$ are shown in solid lines as functions of the base-emitter forward bias $V_{BE}$, sometimes referred to as the body/source bias or voltage $V_{BS}$. The gain, or beta, of the transistor is defined as the ratio of these current values, $I_{BJT}/I_R$, is plotted with a dashed line. FIGS. 2A and 2B thus respectively represent bipolar conduction characteristics and gain of parasitic bipolar transistors formed with an FET having a channel dopant concentration of $6\times10^{17}/cm^3$ and $5\times10^{18}/cm^3$. The source and drain dopant concentrations are generally much higher (e.g. about $10^{20}/cm^3$) and, while important to transistor performance as will be understood by those skilled in the art, specific concentrations are not important to an understanding of the principles of the present invention.

Figure 3A:
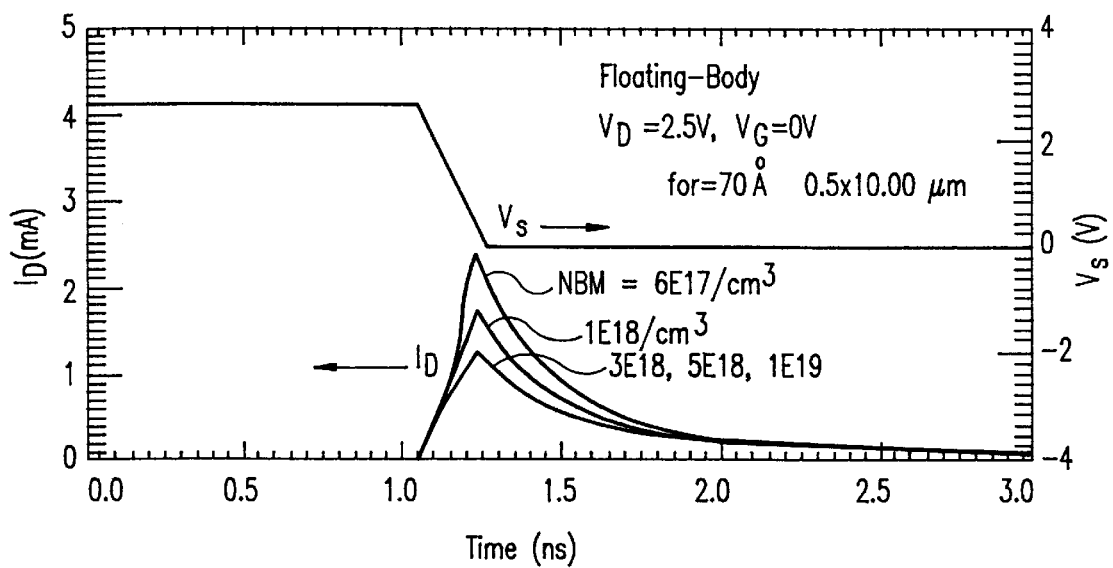
FIGS. 3A and 3B show effects of change of bipolar transistor gain on the half-select write disturb current spike in a SOICMOS SRAM.
Figure 3B:
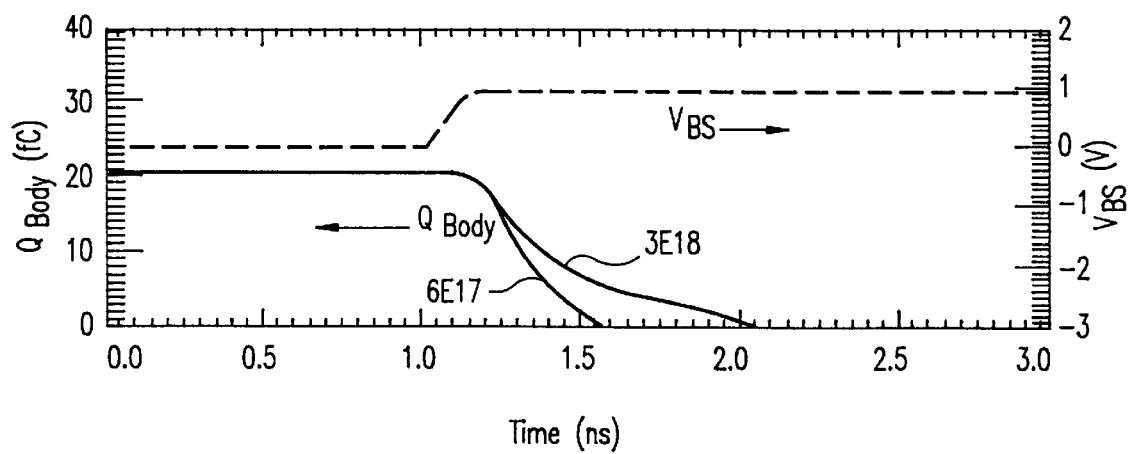

While the Gummel plots of FIGS. 2A and 2B appear generally similar, it should be noted that the $I_R$ curve in FIG. 2B is significantly higher than the $I_R$ curve of FIG. 2A, and the parasitic bipolar current is significantly lower, in the range of $V_{BS}$ between about 0.8 volts and 1.0 volts corresponding to the range of base forward bias developed during transient parasitic bipolar conduction under the conditions discussed above and as graphically depicted by a dashed line in FIG. 3B. Likewise, the toe of the beta curve (gain) in the same range is significantly lower (e.g. reduced from about 15 to less than 10 as $V_{BS}$ approaches 1.0 volts).

The effects of this change on the current spike are substantial and are shown in FIGS. 3A and 3B. Specifically, as shown in FIG. 3A, the amplitude of the current peak is approximately halved by the change in dopant concentration in the portion of the channel region 21' close to the buried oxide layer (e.g. the lower portion of channel region 21') 20' and the consequent reduction in transistor gain. However, further increase in dopant concentration does not produce further reduction of current spike amplitude. Additionally, the speed of response of the transistor is not changed and the current spike represents a potential source of noise as well as load on the power supply in, for example, SRAM and pass gate logic circuits. As shown in the solid curve of FIG. 3B, the discharge of the floating body excess charge occurs in a time interval comparable to the source line fall time. Another important reason body doping in the portion of channel region 21' close to the buried oxide layer 20' is not preferred is because it could affect the threshold voltage of the FET which should be precisely adjusted for proper circuit performance. For these reasons and others alluded to above, adjustment of dopant concentration is not fully effective to reduce the voltage spike due to parasitic bipolar conduction or, in the context of an SRAM, to adequately suppress half-select write disturb and adequately increase memory cell stability.

Figure 4:
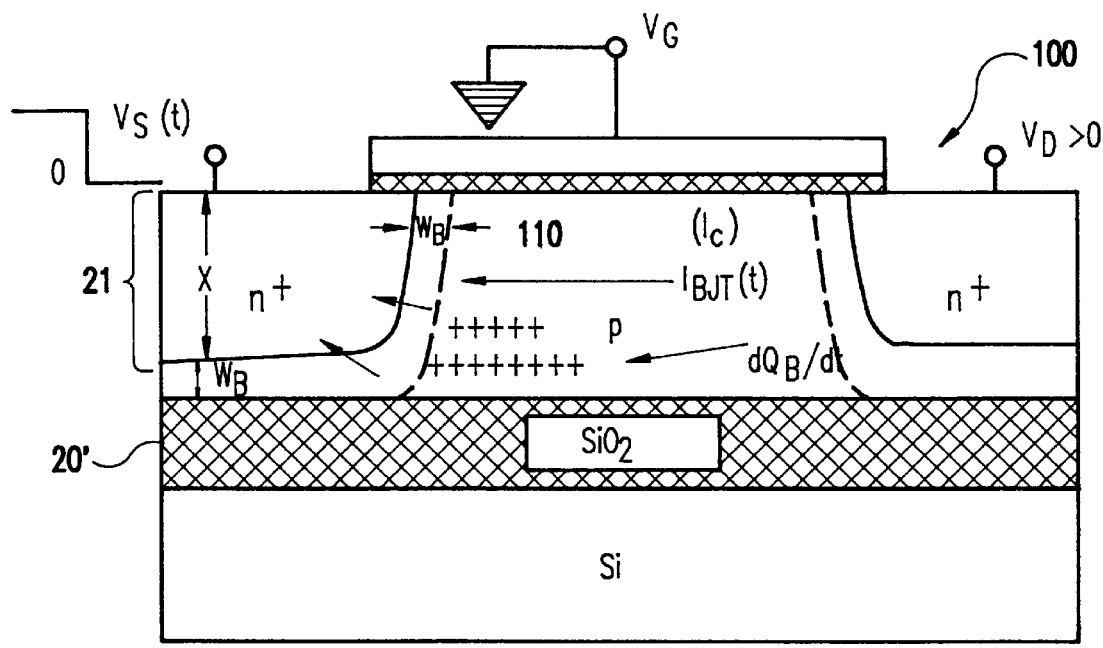
FIG. 4 is a cross-sectional view of an SOI FET in accordance with the present invention.

Referring now to FIG. 4, the improved FET structure 100 in accordance with the invention is shown in cross-section. The structure of the invention differs from the conventional SOI FET of FIG. 1 principally by the fact that the source and drain regions extend only part way through the silicon layer 21 to a depth of $X_j$, leaving a gap between the bottom of the source and/or drain and the insulator layer 20'. However, the depletion region 110 surrounding the source and drain has a minimum width or thickness $W_B$ beyond the doped regions (preferably at zero volts bias between the source or drain region and the silicon layer) which equals or exceeds the remaining depth or gap below the source and drain to the surface of insulator layer 20'.

This geometry of the doped source and drain regions would be expected to present a high capacitance because of the increased area of the junction. In fact, during normal operation, a reverse bias of the source or drain junctions expands the depletion region somewhat so that the areas under the source and drain are not available for charge storage and the area presented by the source and drain and the resulting capacitance, referred to for convenience as the "depletion capacitance" remains substantially unchanged from the conventional transistor of FIG. 1. Thus, the high frequency performance of the SOI FET is maintained.

However, during periods of forward bias of the source-body (SB) junction, corresponding to the emitter-base junction of the parasitic bipolar transistor, the depletion region shrinks to a thickness less than the gap, exposing the area below the source or drain and the area of the effective source-body junction suddenly increases substantially when the bias becomes positive or forward (or sufficiently less negative or reverse that the depletion region no longer fills the gap). This effect has several particularly important aspects for suppressing the parasitic bipolar current spike.

Figure 5:
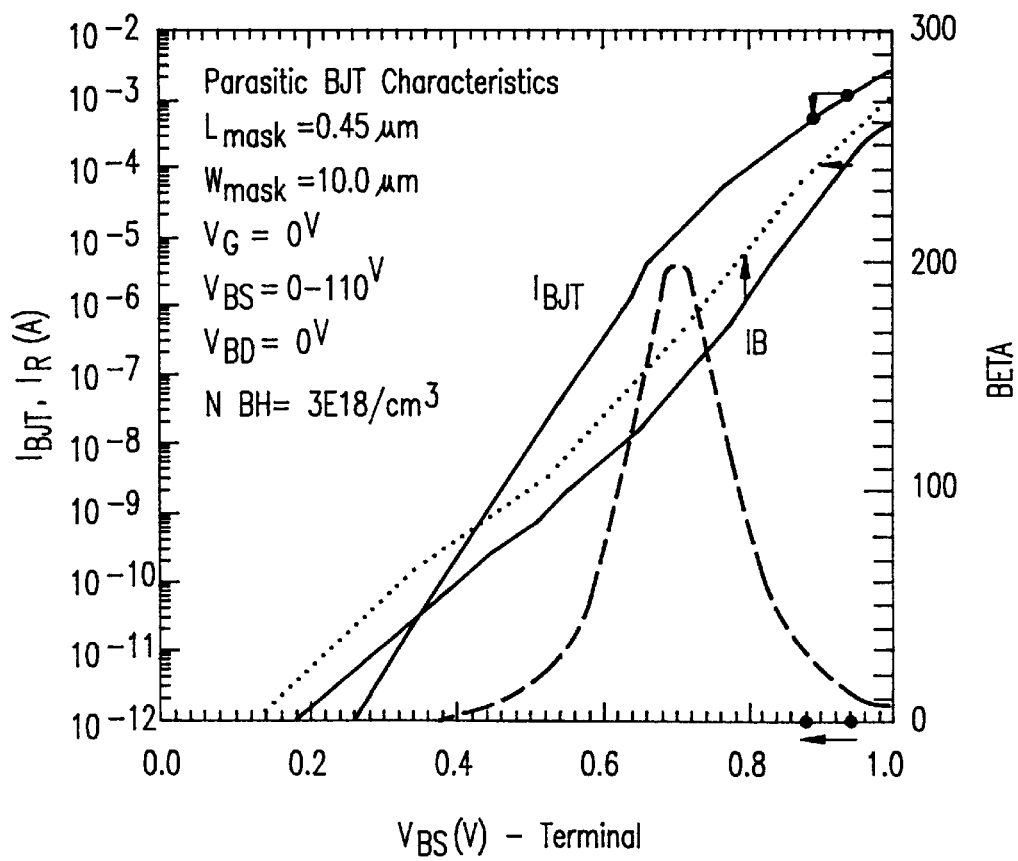
FIG. 5 is a Gummel plot showing the reduction of parasitic bipolar gain in accordance with the invention.

First, the increase in injection area increases the effective recombination current (e.g. base current) density and increases the amount of base current required to produce a given amount of bipolar transistor current as shown by the dashed curve in the Gummel plot of FIG. 5, effectively reducing gain. Further, for the same base current, $V_{BS}$ (e.g. $V_{BE}$) drops along with the resultant bipolar transistor current, $I_{BJT}$. This effect is greater if the current spike is otherwise limited, as discussed in concurrently filed U. S. patent application Ser. No. 08/712,537 (Attorney's Docket No. FI9-96-005), assigned to the assignee of the present invention and fully incorporated herein by reference.

Second, the relative increase in base current $I_R$ effectively reduces the gain of the transistor in the toe region of the dashed beta curve where $V_{BS}$ is in the range of about 0.8–1.0 volts in a manner similar to an increase in channel dopant concentration levels. (In a preferred form of the invention in which the transistors are of geometry comparable to those employed in current commercially available SRAMs, a slightly adjusted channel dopant concentration level of $3\times10^{18}/cm^3$ is preferred which is intermediate the channel dopant concentrations reflected in FIGS. 2A and 2B, respectively. However, it is to be understood that adjustment of dopant concentration is not necessary to the practice of the invention and that the same reduction in gain previously achievable by channel dopant concentration adjustment can be achieved by source and depletion region geometry alone in accordance with the invention.) Reduction in gain relatively reduces transistor transport current for a given base or recombination current.

Third, and perhaps most importantly, when the source-body junction is forward biased, the source/drain area transiently increases the capacitance of the junction, referred to for convenience as the "diffusion capacitance" of the source region (since the lower boundary of the source and drain may be most readily controlled by diffusion after implantation but it is to be understood that the manner of forming the doped source region is substantially unimportant to the practice of the invention and nothing is to be inferred concerning the method of source and drain formation is to be inferred by this nomenclature). The increased diffusion capacitance is effective only in an operating regime in which the junction is forward biased and thus the frequency response of the parasitic bipolar transistor is only transiently degraded for the duration of the forward bias leaving the operation completely unaffected during all other regimes of operation when the source and drain junctions are reverse biased (or unbiased, since the gap is preferably sized in accordance with the width of the depletion region at zero bias) and the depletion region fills the gap below the source and drain.

Figure 6A:
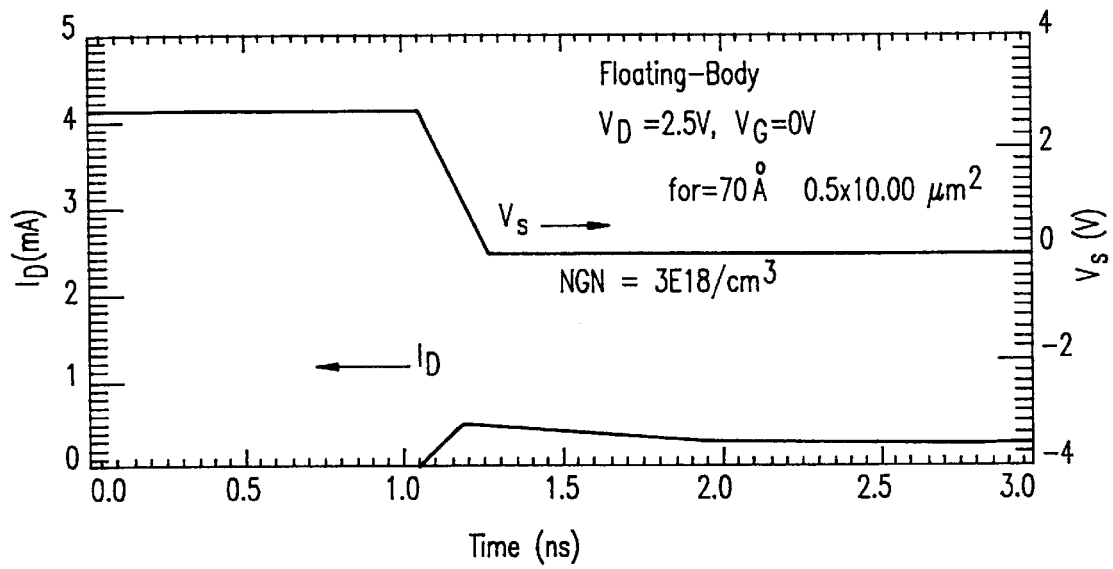
FIGS. 6A and 6B show the effects of change of diffusion capacitance in accordance with the invention on the half-select write disturb current spike for comparison with FIGS. 3A an 3B.
Figure 6B:
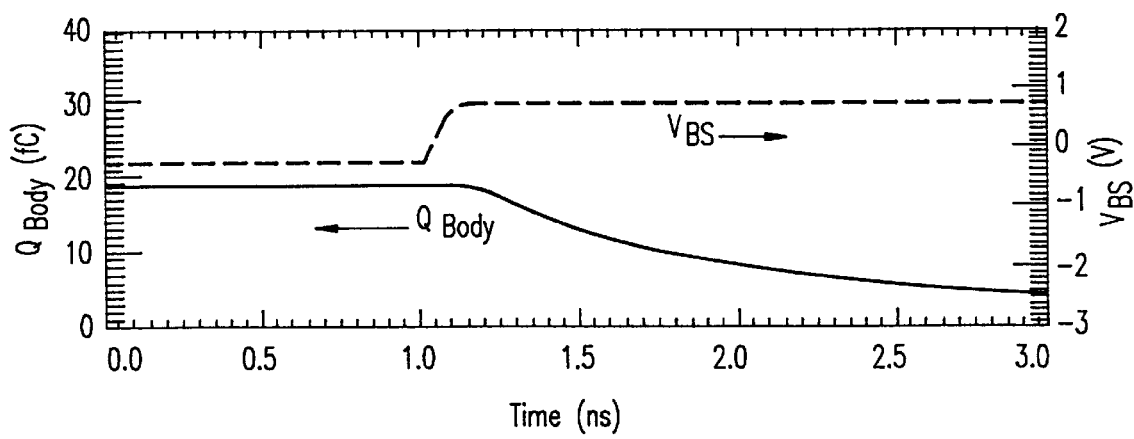

The effect of this latter aspect of the effectively variable geometry of the SOI FET in accordance with the invention is readily seen upon a comparison of FIGS. 6A and 6B with FIGS. 3A and 3B. (FIGS. 6A and 6B are simulations depicting only the effects due to change in diffusion capacitance.) Specifically, the invention limits the peak of the current spike to levels substantially below that achievable through dopant concentration adjustment. The transient discharge is also not as sharp following the source voltage transition and the discharge is very gentle throughout the curve even assuming, as shown, that the forward bias $V_{BS}$ remains the same.

It will be understood by those skilled in the art in view of the above discussion that the meritorious effects of the effectively variable geometry of the transistor in accordance with the invention will accrue in dependence on the effective change in source/drain area which can be achieved. Accordingly, the total area of the source or drain junction should be maximized within the design rules for greatest reduction of the bipolar current peak.

It has been indicated as preferred that the maximum gap below the source be substantially equal to the depletion region thickness at zero volts bias. For a given thickness of silicon layer, this condition corresponds to a thickness of the depletion layer such that the thickness of the silicon layer equals the sum of the source thickness and the depletion layer thickness or $T_{si}=X_j+W_d$. However, referring to FIG. 7 (which depicts results of simulations including the total effects of changeable geometry/capacitance, reduced gain and increased base current/reduced forward bias discussed above), for a given silicon layer thickness, suppression of the current spike during, for example, half-select write disturb, increases with increasing gap width so long as the gap can be filled by the depletion region. In other words, the gap and the depletion layer width are jointly tunable with choice of silicon layer thickness (and source gap area for desired decrease of response speed) so that the effective area increase may occur earlier or later in the source transient (e.g. at a level of reverse bias which would not occur during normal FET operation but prior to forward bias occurring or at a larger positive bias, respectively) allowing controllable onset of reduced response speed and controllable reduction of parasitic bipolar current. However, increasing thickness of the depletion region more than slightly beyond the width of the gap below the source (which would delay onset of reduced high frequency response, gain reduction, etc.) can lead to other problems such as short channel effects, alluded to above, while being of limited anticipated benefit in a SRAM environment and should be limited. It should also be noted that since the source/drain structures do not extend for the full depth of the silicon layer, it is possible to also apply a voltage to the silicon layer to achieve further and/or fine control over the depletion layer thickness.

However, in regard to such tunability of the structure in accordance with the invention, further simulation studies have shown that if a gap below the total thickness of the source and the surrounding depletion region exists at zero volts bias, high frequency performance will be degraded at all levels of reverse bias at which the depletion region does not fill the gap below the source. Further, these simulation studies appear to indicate that an apparent parasitic bipolar current (e.g. a feed through current from the drain to body junction capacitance) will increase with increasing gap below the depletion region at any given bias (e.g. zero volts). Therefore, the preferred design of the transistor in accordance with the invention provides that the depletion region should abut the insulator layer at a zero volts bias and any adjustment or tuning be limited to a small adjustment such that only a very small reverse bias at most will be required for the depletion region to fill the gap in order to limit the gap below the depletion region for anticipated levels of effective parasitic bipolar transistor forward bias. Accordingly, these further simulation studies seem to validate the preferred embodiment described above where the optimal design in the opinion of the inventors should provide that the depletion region at zero volts bias should fill the gap below the source impurity region and insulator layer 20'.

Figure 7:
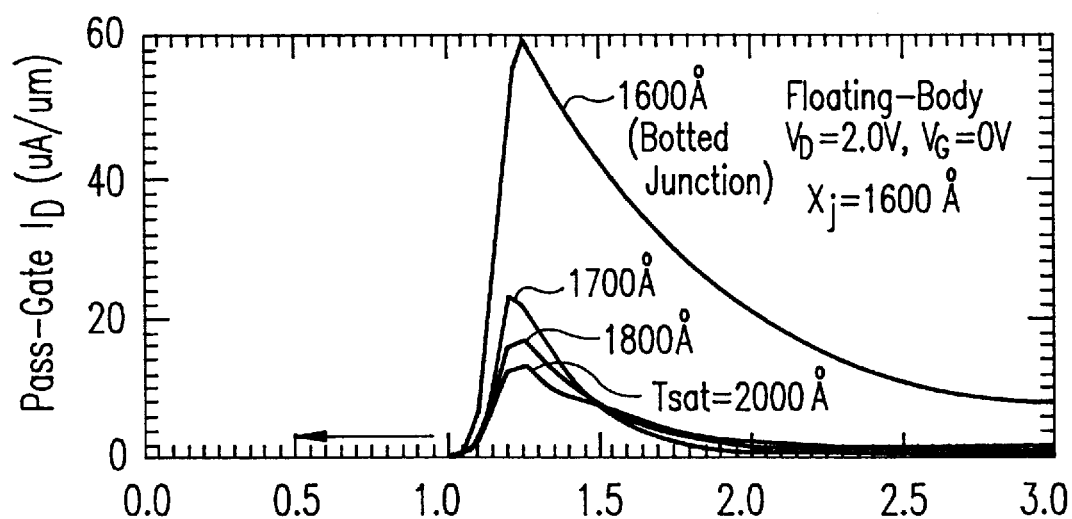
FIG. 7 depicts the dependence of current spike suppression on gap width.

The effectiveness of the invention to suppress transient parasitic bipolar current can be observed from the curves of FIG. 7 for different gaps derived by simulation of different silicon layer thicknesses and for a constant source/drain thickness (junction depth) of 1600 Angstroms. It should be noted, for purposes of comparison that the curve labelled "butted junction" in FIG. 7 should be considered as the limiting case of a conventional SOI FET structure since the source/drain thickness and the silicon layer thickness are the same. It can be observed that increasing width of the gap between the source/drain and insulator may be limited in benefit when the gap becomes particularly large. However, a gap large enough to reach such a limit may correspond to an unrealistic operating condition in some applications since a larger reverse bias might be required to cause the depletion region to fill the gap and/or cause increase of the apparent parasitic bipolar current as discussed above. Nevertheless, the reduction in magnitude of the transient current spike in accordance with the invention is substantially greater (e.g. 65%–85% reduction) than can be obtained by channel dopant concentration adjustment (about 50%).

For generalization of the design of the transistor structure in accordance with the invention, therefore, it should be noted that the gap below the source dominates the production of the meritorious effects of the invention. Accordingly, it is considered preferable to approximate the depletion layer width or thickness by the following familiar equation for thickness $W_d$ of the depletion region:

$$W_d = \sqrt{\frac{2E_s kT}{q^2} \left[ \frac{N_{S/D} + N_B}{N_{S/D} N_B} \right] \ln \left[ \frac{N_{S/D} N_B}{n_i^2} \right]}$$

in which $E_s$ is semiconductor permittivity, k is Boltzman's constant and T is absolute temperature (Kelvin scale), q is electronic charge, N is a dopant concentration of the region indicated by the subscript and $n_i$ is the intrinsic concentration of electrons, for desired operating voltages and onset of parasitic bipolar current and then to choose a silicon layer thickness $T_{si}$ (e.g. approximately 1800–2100 Angstroms is appropriate to current SRAM designs) which will allow $X_j$ to be of a desired separation. That is, $T_{si}=W_d+X_j$. The source depth $X_j$ can then be tailored within the desired range by well-known techniques of implantation and diffusion or any other method (e.g. etching and filling) to obtain a depth defining a gap which will be filled by the depletion region, $W_d$. However, diffusion after implantation is preferred as more readily controllable. In fact, since high frequency response of the FET will be degraded if the depth of the source and drain are insufficient to allow the depletion region to fill the gap, annealing and diffusion can be carried out until the function of the transistor is as desired, thus enhancing potential manufacturing yield.

In view of the foregoing, it is seen that the transistor structure in accordance with the invention reduces parasitic bipolar transistor conduction effects while maintaining high performance of a SOI field effect transistor by transiently reducing both gain and frequency response only for the duration that a junction in the FET is forward biased and when bipolar conduction would dominate. This effectively suppresses the amplitude of the parasitic bipolar current spike and spreads discharge over a sufficiently long period that, as applied to a precharged SRAM, in particular, discharge current can be readily replaced by the bistable memory cell circuit and high memory cell stability is obtained without increase of beta ratio over current designs. High frequency performance of the FET is maintained and the is no operational speed penalty in an SRAM. The novel transistor in accordance with the invention is fully compatible with other techniques of limitation of bipolar conduction current for additional current spike suppression and increase in memory cell stability in SRAMs, including adjustment of source/drain or body dopant concentration and the techniques and devices used in the above-incorporated concurrently filed application. All benefits of floating body and excess charge effects are maintained and enhanced. Manufacturing yield is high and may be increased by tailoring operating characteristics by annealing and diffusion.

While the invention has been described in terms of a single preferred embodiment, those skilled in the art will recognize that the invention can be practiced with modification within the spirit and scope of the appended claims. For example, it is not necessary to provide a gap below both the source and drain to achieve the benefits of the invention from the application of the principles thereof to FET design. However, such a variant of the invention would require separate formation of source and drain regions while potentially realizing the meritorious effects of the invention to a lesser extent than in the preferred embodiment described above. If such a structure were made, a gap larger than a depletion width would be formed under the source region, and no gap would be formed under the drain region. The reduction of parasitic bipolar current would be continuous in such a structure, and not transient as in the present invention. This variant is not presently preferred due to the practical difficulties of making the source and drain junctions of different depths. In addition, operation of the FET in an inverted mode, with the source and drain functions reversed, would be compromised.

Having thus described my invention, what I claim as new and desire to secure by letters patent is as follows:

1. A silicon-on-insulator field effect transistor having respective source and drain regions formed in a silicon layer over an insulator layer, said transistor including a gap between one of said source and drain regions and said insulator layer, said gap being of a width equal to or less than a thickness of a depletion region at approximately zero volts bias between said one of said source and drain regions and said silicon layer.

2. A transistor as recited in claim 1, wherein said gap is of a width equal to a thickness of a depletion region at zero volts bias between said one of said source and drain regions and said silicon layer.

3. A transistor as recited in claim 1, having a channel dopant concentration of approximately $3 \times 10^{18}/cm^3$.

4. A transistor as recited in claim 1, having a channel dopant concentration of approximately $6 \times 10^{17}/cm^3$.

5. A transistor as recited in claim 2, having a channel dopant concentration of approximately $3 \times 10^{18}/cm^3$.

6. A transistor as recited in claim 2, having a channel dopant concentration of approximately $6 \times 10^{17}/cm^3$.

7. A digital logic circuit including a silicon-on-insulator field effect transistor, said transistor having respective source and drain regions formed in a silicon layer over an insulator layer, said transistor including a gap between one of said source and drain regions and said insulator layer, said gap being of a width equal to or less than a thickness of a depletion region at approximately zero volts bias between said one of said source and drain regions and said silicon layer.

8. A transistor as recited in claim 7, wherein said gap is of a width equal to a thickness of a depletion region at zero volts bias between said one of said source and drain regions and said silicon layer.

9. A transistor as recited in claim 7, having a channel dopant concentration of approximately $3 \times 10^{18}/cm^3$.

10. A transistor as recited in claim 7, having a channel dopant concentration of approximately $6 \times 10^{17}/cm^3$.

11. A transistor as recited in claim 8, having a channel dopant concentration of approximately $3 \times 10^{18}/cm^3$.

12. A transistor as recited in claim 8, having a channel dopant concentration of approximately $6 \times 10^{17}/cm^3$.

13. A digital logic circuit as recited in claim 7, wherein said digital logic circuit includes a memory cell and said transistor is a transfer gate transistor connected to said memory cell.

14. A digital logic circuit as recited in claim 13, wherein said memory cell is a bistable circuit.

15. A method of operating a silicon-on-insulator field effect transistor including the steps of causing a depletion region to fill a gap between one of a source region and a drain region of said silicon-on-insulator field effect transistor and an insulator layer below said field effect transistor, and transiently reducing thickness of said depletion region to a thickness less than said gap.

16. A method as recited in claim 15, including the further step of applying a voltage to a silicon layer in which said silicon-on-insulator field effect transistor is formed.

17. A method as recited in claim 15, including the further steps of applying a high logic level voltage to both a source and a drain of said field effect transistor, and subsequently applying a low logic level voltage to one of said source and a drain of said field effect transistor.

18. A method as recited in claim 17, including the further step of limiting a parasitic bipolar current in said field effect transistor with an impedance in a discharge circuit connected to said field effect transistor.

19. A method as recited in claim 15, including the further step of limiting gain of a parasitic bipolar transistor formed with said field effect transistor by channel dopant concentration.

20. A method as recited in claim 15, wherein said step of transiently reducing thickness of said depletion region includes the further step of transiently reducing high frequency response of said field effect transistor.

21. A method as recited in claim 15, wherein said step of transiently reducing thickness of said depletion region includes the further step of transiently reducing gain of a parasitic bipolar transistor formed with said field effect transistor.

* * * * *

UNITED STATES PATENT AND TRADEMARK OFFICE
CERTIFICATE OF CORRECTION

PATENT NO. : 5,770,881
DATED : June 23, 1998
INVENTOR(S) : Mario M.A. Pelella, et. al.

It is certified that error appears in the above-identified patent and that said Letters Patent is hereby corrected as shown below:

Title page, item [73], Assignee: should read --CORPORATION--.

Signed and Sealed this

Twenty-second Day of September, 1998

Attest:

BRUCE LEHMAN

Attesting Officer

Commissioner of Patents and Trademarks